(12) United States Patent
Hwang et al.

(10) Patent No.: US 7,757,153 B2
(45) Date of Patent: Jul. 13, 2010

(54) MULTI-BIT MEMORY DEVICE AND MEMORY SYSTEM

(75) Inventors: Sang-Won Hwang, Suwon-si (KR); Jong-Soo Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 895 days.

(21) Appl. No.: 11/605,977

(22) Filed: Nov. 30, 2006

(65) Prior Publication Data

US 2007/0234183 A1    Oct. 4, 2007

(30) Foreign Application Priority Data

Mar. 31, 2006    (KR) ..................... 10-2006-0029691

(51) Int. Cl.
*G11C 29/00*    (2006.01)

(52) U.S. Cl. ...................................... 714/763; 714/710

(58) Field of Classification Search .................. 714/763, 714/710
See application file for complete search history.

(56) References Cited

U.S. PATENT DOCUMENTS

| | | | | |
|---|---|---|---|---|
| 4,608,687 A | * | 8/1986 | Dutton ........................ | 714/710 |
| 5,452,429 A | * | 9/1995 | Fuoco et al. ..................... | 714/6 |
| 5,475,693 A | | 12/1995 | Christopherson et al. | |
| 5,559,956 A | * | 9/1996 | Sukegawa ....................... | 714/8 |
| 5,784,548 A | * | 7/1998 | Liong et al. ..................... | 714/6 |
| 5,920,502 A | * | 7/1999 | Noda et al. ............ | 365/185.09 |
| 6,002,612 A | * | 12/1999 | Noda et al. ............ | 365/185.09 |
| 6,046,939 A | * | 4/2000 | Noda et al. ............ | 365/185.09 |
| 6,349,390 B1 | * | 2/2002 | Dell et al. ....................... | 714/6 |
| 6,353,553 B1 | | 3/2002 | Tamada et al. | |
| 6,442,726 B1 | * | 8/2002 | Knefel ........................ | 714/763 |
| 6,549,459 B2 | | 4/2003 | Higuchi | |
| 6,697,976 B1 | * | 2/2004 | Satoh et al. .................. | 714/704 |
| 6,715,116 B2 | * | 3/2004 | Lester et al. ................. | 714/718 |

FOREIGN PATENT DOCUMENTS

| | | |
|---|---|---|
| JP | 2001-210082 | 8/2001 |
| JP | 2003022687 A | 1/2003 |
| KR | 100205240 B1 | 4/1999 |
| KR | 1020010077868 | 8/2001 |
| KR | 100332950 B1 | 4/2002 |
| KR | 1020030023349 | 3/2003 |
| KR | 1020050116283 A | 12/2005 |
| WO | WO 96/20443 | 7/1996 |

\* cited by examiner

*Primary Examiner*—M. Mujtaba K Chaudry
(74) *Attorney, Agent, or Firm*—Volentine & Whitt, PLLC

(57) ABSTRACT

A nonvolatile memory device, memory system and read method are disclosed. The memory device comprises a memory cell array comprising a plurality of memory blocks each having a plurality of memory cells adapted to store N bits, where N is an integer greater than 1, a page buffer configured to perform a read operation adapted to read data from the memory cell array and output read data, an error correction circuit configured to detect and correct an error in read data stored in a memory block K and generate corresponding error information, and a control circuit configured to reduce the number of bits stored in the plurality of memory cells for memory block K from N to J, where J is an integer less than N but greater than zero, in response to the error information.

20 Claims, 9 Drawing Sheets

<SLC>

<MLC>

MULTI-BIT MEMORY DEVICE AND MEMORY SYSTEM

BACKGROUND OF THE INVENTION

1. Field of the Invention

The present invention relates to a nonvolatile memory device and memory system incorporating same. More specifically, the present invention is directed to electrically programmable/erasable nonvolatile memory cells and related memory systems.

This non-provisional patent application claims priority under 35 U.S.C §119 to Korean Patent Application 2006-29691 filed on Mar. 31, 2006, the entirety of which is hereby incorporated by reference.

2. Description of Related Art

Due to their ease of use, electrically programmable/erasable nonvolatile memories such as flash memory are rapidly replacing other types of nonvolatile memory, such as erasable programmable read only memories (EPROMs) or mask read only memories (mask ROMs), in the design of many contemporary host devices. For example, flash memory is now commonly used to store programming code.

Indeed, with advances in related semiconductor fabrication technologies, flash memory is increasingly used to provide mass storage capabilities in such devices as digital still cameras and portable audio devices. Current research is focused on providing even greater data storage capabilities for flash memory so that it may be more readily incorporated in video and video recording devices, HDD replacements, etc.

One important technology adapted to improve the data storage capabilities of flash memory is the use of multi-bit memory cells and related programming methods. To store data in conventional flash memory cells, electrical charge is accumulated on or discharged from a floating gate within each memory cell. In a conventional 1-bit flash memory cell, data is stored in relation to two threshold voltage distributions (i.e., two floating gate voltage states equating to digital logic states of "0" and "1").

However, in flash memory cells adapted to store multi-bit data, at least three and typically four threshold voltage states are defined. For example, in a flash memory cell capable of storing 2 bit data, four threshold voltage distributions for the memory cell are defined to correspond to digital logic states of "00", "01", "10", and "11", respectively. Using this expanded range of voltage distributions, 2-bit data may be stored on a single memory cell. The digital logic states may be assigned to corresponding voltage distributions as a matter of design choice. However, the use of an increased number of voltage distributions to indicate multi-bit data states necessarily reduces the voltage margins between the various threshold voltage distributions.

Figure (FIG.) 1 shows exemplary threshold voltage distributions (i.e., 1st and 2nd states) for a single-bit (or level) flash memory cell (SLC) in comparison with exemplary voltage distributions (i.e., 1st through 4th states) for a multi-bit memory cell (MLC).

As may be seen from FIG. 1, the threshold voltage distributions for the single-bit flash memory cell enjoy a considerable voltage margin (i.e., separation). This large voltage margin makes discrimination between stored digital logic states relatively easy. On the other hand, the threshold voltage distributions for the multi-bit flash memory cell are respectively separated by much reduced voltage margins.

The processes of accumulating and discharging electrons on and from a floating gate in a multi-bit flash memory cell, (i.e., processes that define a desired voltage distribution), require a delicate balance of applied control voltages in relation to an energy barrier defined by an insulation layer separating the floating gate from an underlying substrate. There are many fabrication and operational variables that influence these processes. For example, if the insulation layer is thinner or thicker than designed, or if applied control voltages are too high or too low, data programming errors may occur. The effects of such variables are exacerbated by the reduced margins between voltage distributions in a multi-bit flash memory cell.

Additionally, charge may leak from a floating gate over time. Leaking charge may eventually result in a changed voltage distribution, and an erroneous data state. Finally, the capability of flash memory cells to securely store charge tends to diminish over time (i.e., after being programmed and read many times).

Many of these data retention and data programming challenges are actually prevalent in single-bit flash memory cells as compared with multi-bit flash memory cells. However, the data transfer speed of most single-bit flash memory is superior to that of the multi-bit flash memory.

FIG. 2 illustrates an exemplary memory cell array for a conventional nonvolatile memory device. The memory cell array is formed from single-bit electrically erasable and programmable memory cells (EEPROM cells), each cell having a floating gate. It will be understood by those skilled in the art that while the memory cell array illustrated in FIG. 2 corresponds to one memory block, multiple memory blocks may be provided in the memory cell array. Storing charge on the floating gate of each EEPROM cell is accomplished by varying the threshold voltage of the EEPROM cell between a low-level value indicating a logic state of "1" and a high-level value indicating a logic state of "0".

Left in a steady state condition, the floating gate may well retain any stored charge indefinitely. However, since highly energetic charge injection and emission mechanisms are used to repeatedly manipulate the charge state on the floating gate, insulation defects and charge traps are often formed within the insulation layer surrounding the floating gate (e.g., the tunnel oxide). The development of such defects and traps creates reliability problems most commonly manifest during write and erase operations applied to the memory cell. That is, stored electrons may be emitted (i.e., discharge) from the floating gate via defects and traps in the tunnel oxide. Alternately, a floating gate slowly accumulates additional electrons when a control gate has a power supply voltage applied to it during a read operation.

The uncontrolled and undesired loss (leakage) or accumulation of charge on a floating gate inevitably results in an increased or decreased threshold voltage for the EEPROM memory cell. Such threshold voltage deviations result in randomly occurring data bit errors. In view of this result, most contemporary nonvolatile memories include an error correction circuit (ECC) or an error correction control method adapted to detect and/or correct random bit errors.

FIG. 3 is a block diagram of an exemplary nonvolatile memory including an error correction circuit (ECC). The nonvolatile memory includes a memory cell array 300, a write reading circuit (commonly called a "page buffer") 302, an error correction circuit (ECC) 306, an address decoding and control circuit 308, and a column gating circuit 304. Memory cell array 300 includes electrically rewritable memory cells arranged in a matrix. Page buffer 302 latches write data to be written into memory cell 300, as well as data read from memory cell array 300. ECC 306 generates check data used to detect and correct errors in the page buffer data. Address decoding and control circuit 308 outputs and decodes a control signal for writing data to and reading data from memory cell 300 and controls input/output of data from page buffer 302. Column gating circuit 304 operates in response to address information provided from address decoding and control circuit 308. Memory cell array 300 is configured in memory blocks, each having a series of successively arranged memory cells. The memory cells of the memory blocks are connected to page buffer circuit 302 through a series of bit lines.

FIG. 4 illustrates the operation of a nonvolatile memory including an error correction circuit (ECC) 406. When an externally applied read command is received, the nonvolatile memory performs a read operation. During a read operation, the nonvolatile memory reads data stored at an indicated address in the memory cell array. The read data is detected (or "sensed") by and stored in a constituent latch circuit within page buffer 402. The sensed and latched read data is then transferred to a column gating circuit 404 associated with ECC 406. ECC 406 seeks within its range of competency to detect and correct error(s) in the read data. During this process, ECC 406 makes use of ECC code (e.g., parity data bit(s)) stored in the memory cell array in association with the actual data. Using this ECC code, ECC 406 may detect and correct data error(s) before outputting the read data to external circuits, such as a host device associated with the memory.

Error(s) in the read data may in many instances be due to degradations resulting from repeated programming and erasure operations applied to the nonvolatile memory device. In terms of general error generation characteristics, the possibility of repeated error generation is very high for a memory block in the memory cell array having previously detected errors. Using conventional approaches such memory blocks are merely treated as "bad blocks" and not used in subsequent read/write operations. Prior to being blocked off from further use, the data in a designated bad block is copy-backed to another memory block.

So-called, "progressive errors" are more commonly generated in nonvolatile memory devices including multi-bit memory cells. Such errors result in reduced reliability of conventional multi-bit nonvolatile memory devices and the designation of many bad blocks. However, the designation of multiple bad blocks leads to reducing overall data storage capacity. Such a reduction in memory capacity cuts against the primary motivation for using multi-bit nonvolatile memory devices in the first place, (i.e., greater data storage capacity achieved through higher data to memory cell integration densities).

Accordingly, there is a requirement for developing memory devices and related memory systems that combine the superior data storage capacity of a multi-bit flash memory cells with the high reliability of a single-bit flash memory cells.

SUMMARY OF THE INVENTION

In one embodiment, the invention provides a nonvolatile memory device comprising; a memory cell array comprising a plurality of memory blocks each having a plurality of memory cells adapted to store N bits, where N is an integer greater than 1, a page buffer configured to perform a read operation adapted to read data from the memory cell array and output read data, an error correction circuit configured to detect and correct an error in read data stored in a memory block K and generate corresponding error information, and a control circuit configured to reduce the number of bits stored in the plurality of memory cells for memory block K from N to J, where J is an integer less than N but greater than zero, in response to the error information.

In another embodiment, the invention provides a non-volatile memory system comprising; a memory controller configured to control read operations associated with a nonvolatile memory device, the nonvolatile memory device comprising, a memory cell array comprising a plurality of memory blocks each having a plurality of memory cells adapted to store N bits, where N is an integer greater than 1, wherein the memory cell array comprises a main data storage region adapted to store data and a spare data storage region adapted to store spare data associated with the data stored in the main storage region, and a page buffer configured to perform the read operation in relation to the memory cell array and output read data, the memory controller being configured to implement an error correction capability (ECC) adapted to detect and correct an error in the read data stored in a memory block K, and reduce the number of bits stored in the plurality of memory cells for memory block K from N to J, where J is an integer less than N but greater than zero, in response to the error detection.

In another embodiment, the invention provides a read method for a nonvolatile memory device comprising a plurality of memory blocks, each comprising memory cells adapted to store N bits, where N is an integer greater than 1, the method comprising; upon receiving an externally applied read command associated with a memory block K, determining whether read data stored in memory block K is single-bit data or multiple-bit data, if the read data is single-bit data and contains an error, reading and performing an error correction operation on the single-bit data, and marking memory block K as a bad block, else if, the read data is multi-bit data and contains an error, reading and performing an error correction operation on the multi-bit data, and reducing the number of bits stored in the memory cells of memory block K from N to J, where J is an integer less than N but greater than zero.

DESCRIPTION OF EMBODIMENTS

Embodiments of the invention will now be described in some additional detail with reference to the accompanying drawings. However, the invention may be embodied in many different forms and should not be construed as being limited to only the embodiments set forth herein. Rather, the illustrated embodiments are presented as teaching examples. Throughout the specification and drawings, like reference numbers refer to like or similar elements.

Figure 1:
FIG. 1 illustrates threshold voltage distributions of a single-bit flash memory and a double-bit flash memory.
Figure 1:
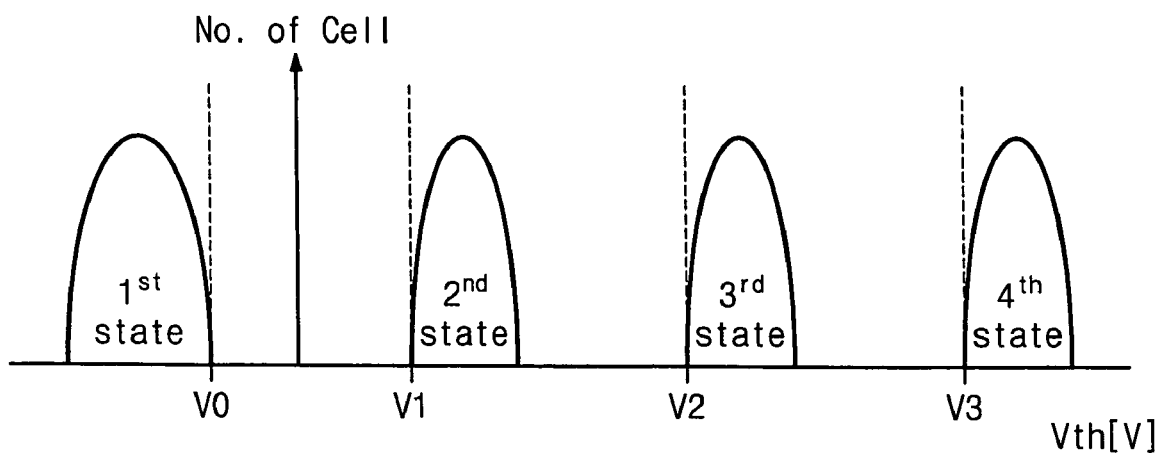
Figure 2:
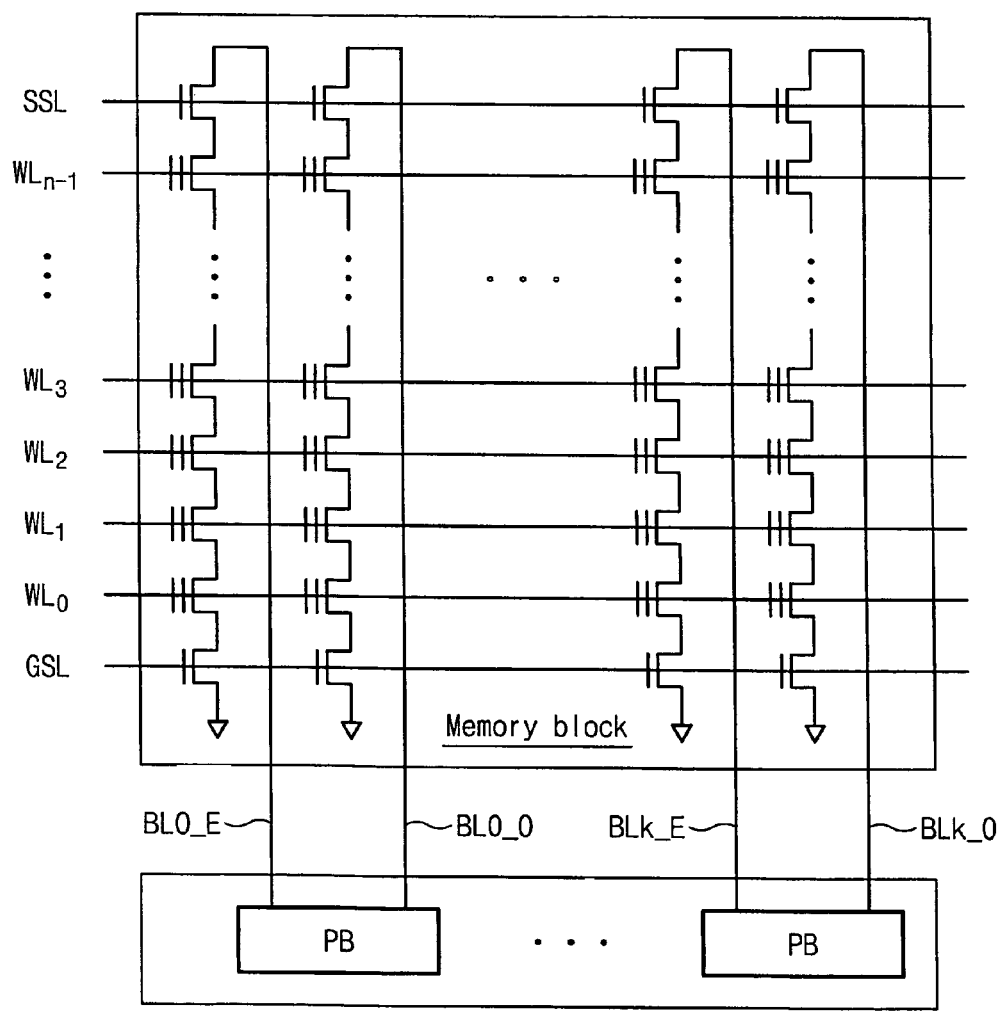
FIG. 2 illustrates a memory cell array of a nonvolatile memory device.
Figure 3:
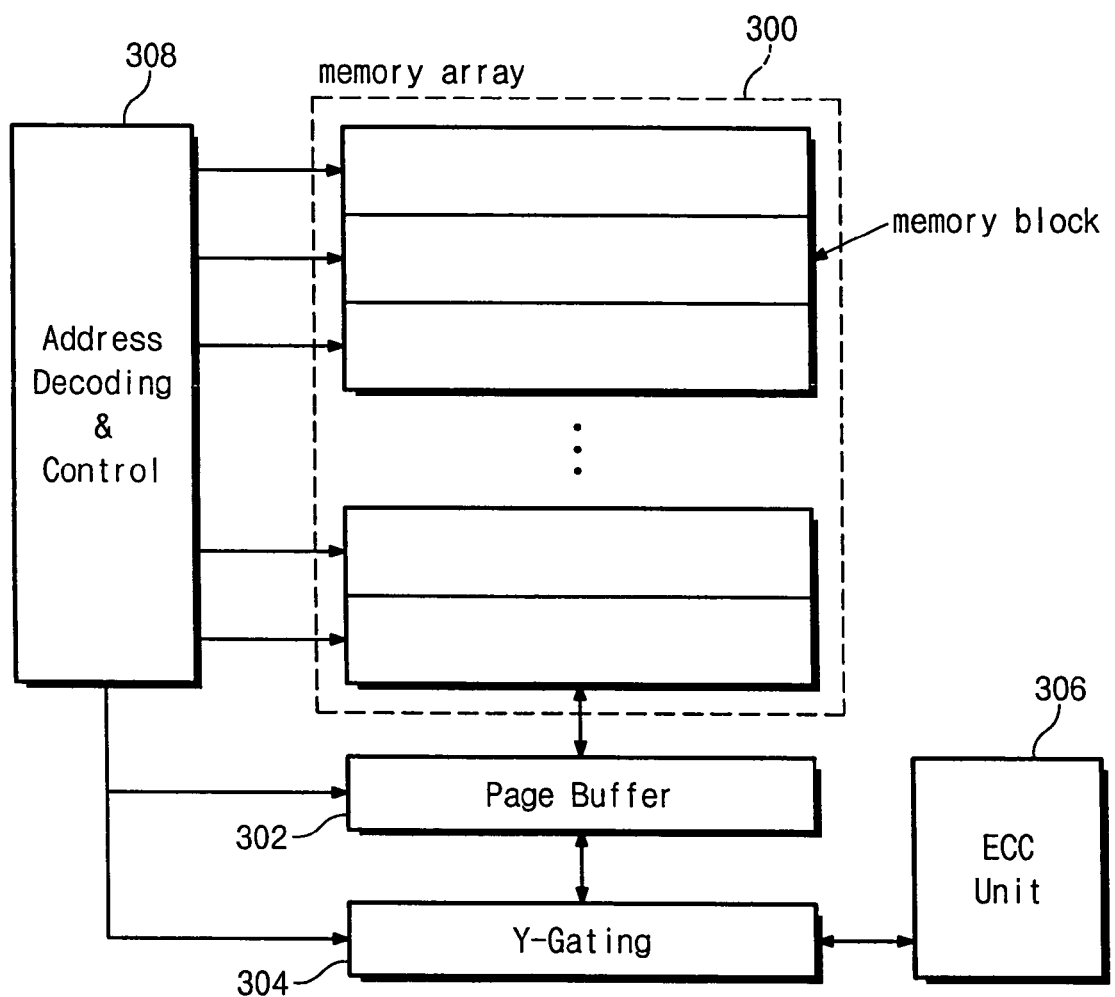
FIG. 3 is a block diagram of a nonvolatile memory device including an error correction circuit (ECC).
Figure 4:
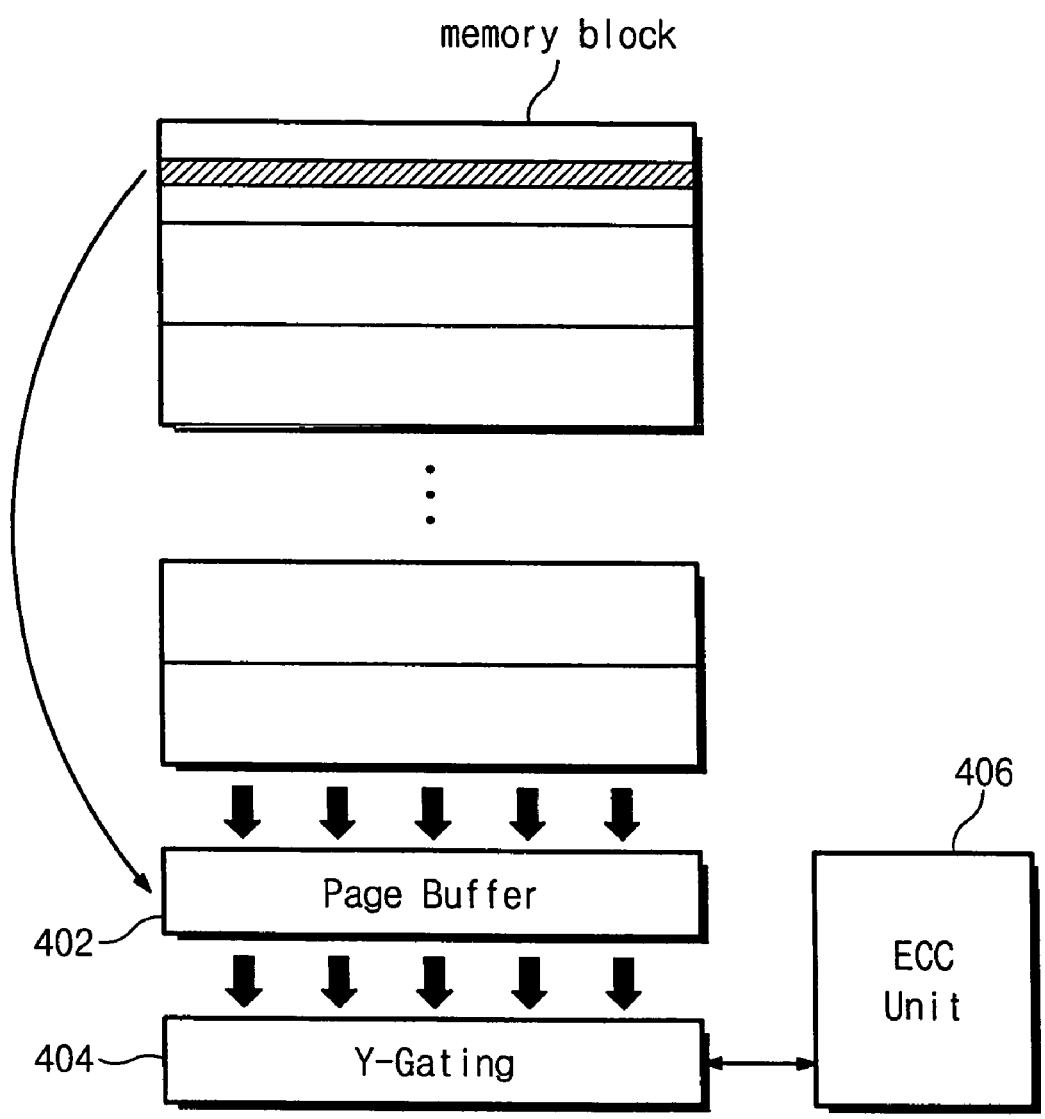
FIG. 4 illustrates an operation of a nonvolatile memory including an error correction circuit.
Figure 5:
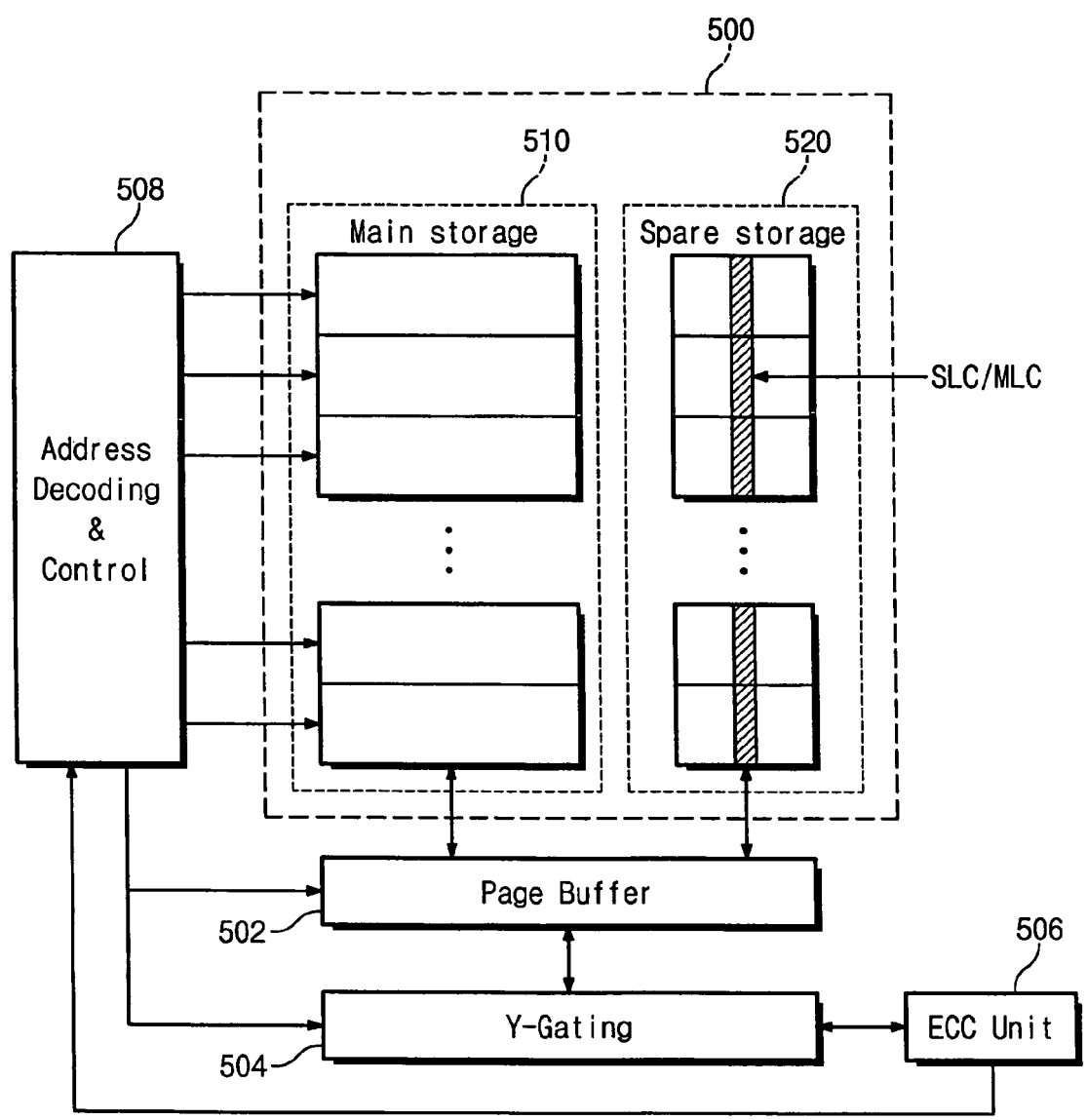
FIG. 5 is a block diagram of a nonvolatile memory including an error correction circuit (ECC) according to the present invention.

FIG. 5 is a block diagram of a nonvolatile memory including an error correction circuit (ECC) according to an embodiment of the invention. The nonvolatile memory includes a memory cell array 500, a page buffer 502, an error correction circuit (ECC) 506, an address decoding and control circuit 508, and a column gating circuit 504. Memory cell array 500 includes a plurality of memory blocks each having a plurality of nonvolatile memory cells. Page buffer 502 latches write data to be written into memory cell array 500 and read data read from memory cell array 500. ECC 506 generates ECC data (e.g., check data) adapted to facilitate the detection and correction of errors in the write data and read data. Address decoding and control circuit 508 outputs and decodes a control signal for writing data to and reading data from memory cell array 500 and controls the input of data to and output of data from page buffer 502. (Address decoding and control circuit 508 is merely one example of a "control circuit" adapted to the purposes of embodiments of the invention. Such a control circuit may be associated with addressing functions, or not). Column gating circuit 504 operates in response to address information provided by address decoding and control circuit 508.

Memory cell array 500 is further divided into a main storage region 510 in which "main data" is stored and a spare storage region 520 in which "spare data" related to the main data is stored. Spare storage region 520 includes a bit number data. In one embodiment, a SLC/MLC flag is used as one form of bit number data (i.e., data used to indicate bit-per-cell information associated with each memory block). The SLC/MLC flag is used to determine whether N bit data (where N is an integer greater than 1) per cell is stored in main storage region 510 or whether J bit data (where J is greater than zero but less than N) per cell is stored therein.

Data indicating whether a corresponding memory block is a bad block, may also be stored in spare storage region 520. Further, error correction code (ECC code) associated with data stored in main storage region 510 may also be stored in spare storage region 520. Additionally, it will be apparent to those skilled in the art that a variety of spare data may be stored in spare storage region 520. Further, spare storage region 520 may use the same type of SLC or MLC used in main storage region 510, or it may use a different type of memory cell as that used in main storage region 510 to enhance reliability.

Figure 6:
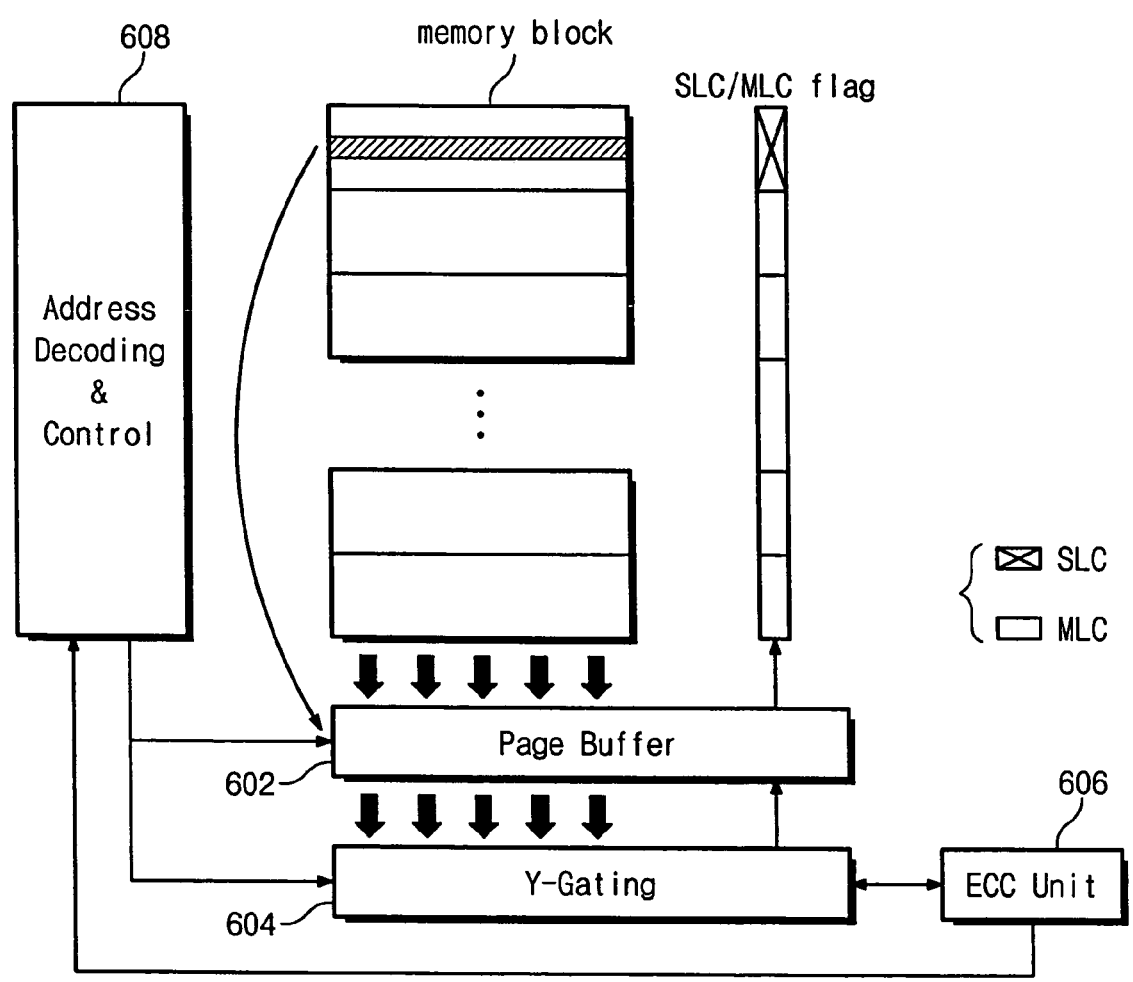
FIG. 6 illustrates an operation of a nonvolatile memory including an error correction circuit according to the present invention.

FIG. 6 illustrates one exemplary method of operation for the nonvolatile memory of FIG. 5. When an externally supplied read command is received, the nonvolatile memory performs a read operation. Read data is sensed by and latched in a page buffer 602. The sensed and latched data is then transferred to an error correction circuit (ECC) 606 via a column gating circuit 604. ECC 606 detects whether one or more error(s) is contained within the read data stored in column gating circuit 604.

In a case where at least one error is detected in the stored read data, ECC 606 indicates the presence of an error to address decoding and control circuit 608. This indication may take the form of error information communicated to address decoding and control circuit 608. According to received error information, address decoding and control circuit 608 (or a separate memory controller) may update data associated with the memory block containing the error(s) stored in spare storage region. This updated data stored in the spare storage region may relate to the number of bits to be subsequently stored in the block containing the detected error.

For example, when an error is detected by ECC 606 during a read operation performed in relation to a memory block K (e.g., an error-detected memory block) currently storing N bits of data, error information regarding memory block K is passed to address decoding and control circuit 608. In response to the received error information, address decoding and control circuit 608 may change the value of an SLC/MLC flag stored in an associated spare storage region, such that only J bits of data will be subsequently stored in each memory cell of memory block K. Thereafter, page buffer 602 may conduct single-bit read/write operation, for example, in relation to memory block K.

If data error problems persist with memory block K, successive error detection, error information communications, and adjustments to the SLC/MLC flag value in the spare storage region may reduce the read margin burden placed upon memory cells in memory block K. For example, an initial value of N=4 associated with multi-value memory cells in memory block K may be reduced to a value of J=3, and then subsequently to a value of J=2. In such an example, the SLC/MLC flag may be implemented as a multi-bit memory cell. Ultimately, if error generation problems associated with memory K persist, the block may be identified as a bad block and removed from use within the memory system.

In a case where memory block K is treated as a bad block and its reuse is prohibited (i.e., a SLC/MLC flag value of J=0), the data stored in memory block K may be transferred to another memory block using a copyback operation. The copyback operation may be conducted in such a manner that data stored in memory block K is directly stored at a new address indicating a new memory block without first temporarily storing the data in an internal page buffer and reading the temporarily stored data from the page buffer to a data storage location outside of the memory. This ability enhances the overall performance and speed of the constituent memory system.

Figure 7:
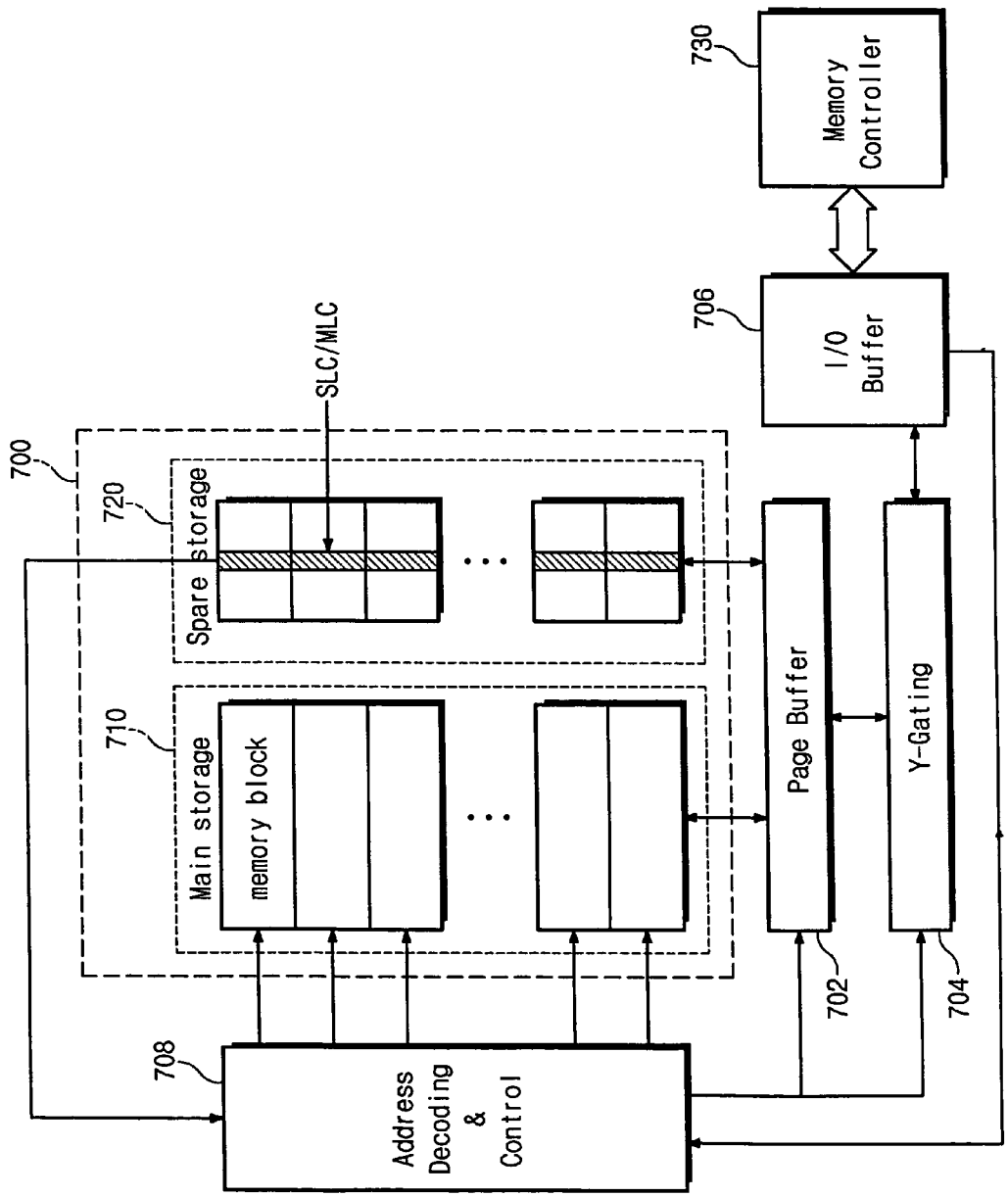
FIG. 7 is a block diagram of a nonvolatile memory system according to the present invention.

FIG. 7 is a block diagram of a nonvolatile memory system according to an embodiment of the invention. The nonvolatile memory system includes a nonvolatile memory device comprising memory cell array 700, a page buffer 702, an address decoding and control circuit 708, a column gating circuit 704, and a nonvolatile memory controller 730. Nonvolatile memory controller 730 is connected to the nonvolatile memory device by I/O buffer 706.

As before, memory cell array 700 includes a plurality of memory blocks each having a plurality of nonvolatile memory cells. Page buffer 702 conducts read/write operations. Address decoding and control circuit 708 decodes address data and controls input/output of data. Column gating circuit 704 in conjunction with I/O circuits 706 operates in response to address information from address decoding and control circuit 508.

However, in the illustrated embodiment, an error correction capability ECC adapted to detect and correct error(s) in read data is implemented using I/O buffer 706 and nonvolatile memory controller 730 in conjunction with address decoding and control circuit 708. Further, nonvolatile memory controller 730 controls operation of the nonvolatile memory device to read/write and erase data, etc.

Thus, error detection and correction may be conducted by nonvolatile memory controller 730 instead of the nonvolatile memory device. For example, nonvolatile memory controller 730 may include a dedicated error correction circuit, or error detection and correction functions may be performed, wholly or in part, using software, firmware and/or hardware.

Read data output from memory array 700 in response to the received read command may be communicated to memory controller 730 via page buffer 702, column gating circuit 704, and I/O buffer 709. Using the ECC capabilities inherent in memory controller 730, error(s) in the read data transmitted from the nonvolatile memory controller 730 may be detected and corrected. When there is an error in the read data, nonvolatile memory controller 730 will indicate such to the nonvolatile memory device (e.g., to address decoding and control circuit 708). At this point, in a manner similar to the foregoing, error information may be communicated to address decoding and control circuit 708, the value of a SLC/MLC flag associated with the memory block containing the error(s) may be altered in spare storage region 720, etc.

Figure 8:
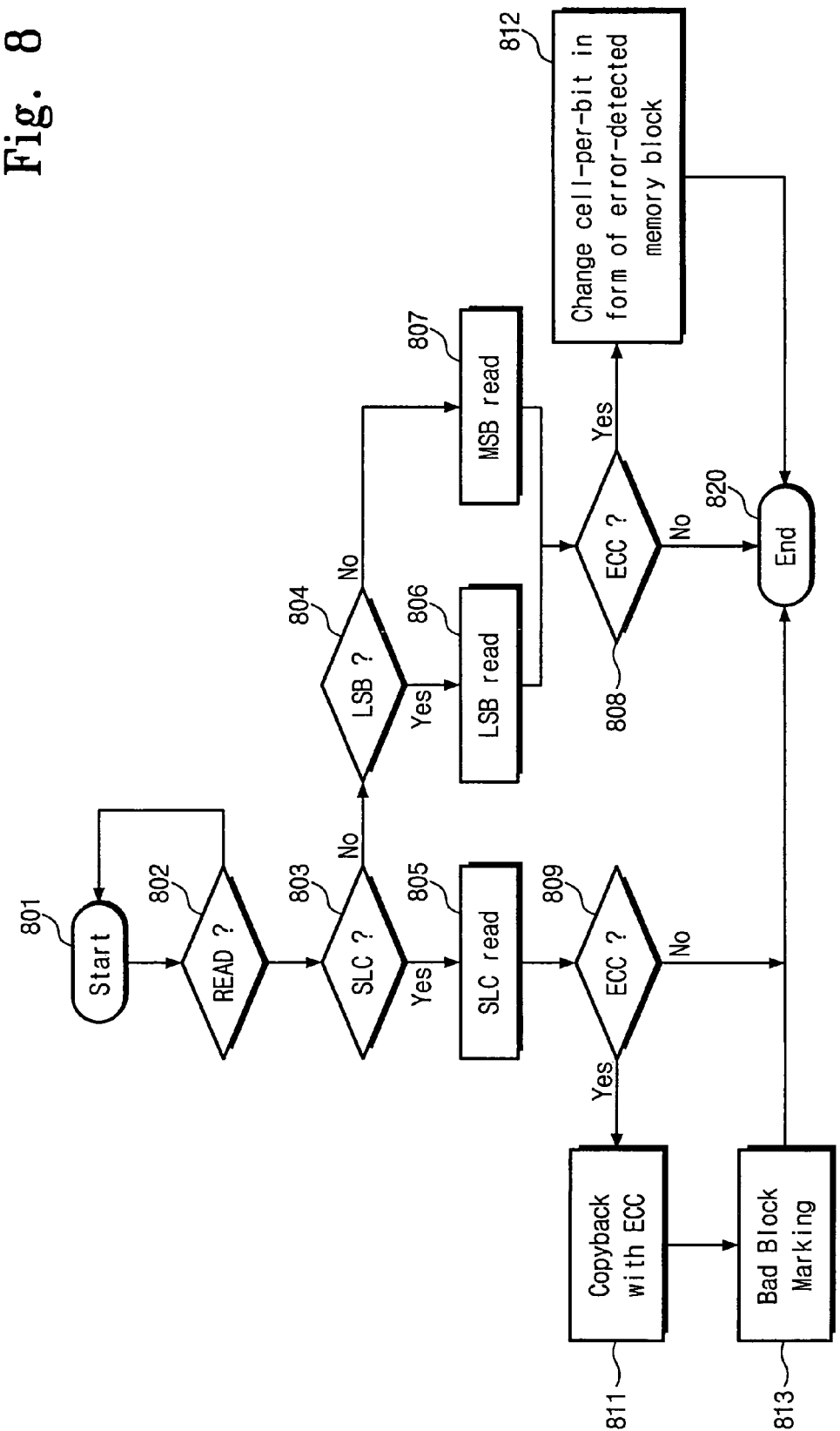
FIG. 8 is a flowchart illustrating a read operation method of a read operation of a nonvolatile memory device which is capable of storing N bits per cell (N>1) according to the present invention.

FIG. 8 is a flowchart illustrating an example of a read operation which may be performed in a memory system consistent with the foregoing embodiments. This example assumes use of a 2-bit MLC for purposes of illustration, but other MLCs might be alternately used. Upon receiving an externally applied read command, the read operation begins (S802). A determination is then made as to whether the read operation implicates single-bit memory cell operation or a multi-bit memory cell operation (S803). This determination may be made, for example, by referencing data stored in a spare storage region, as indicated by received address information associated with the read operation.

If a MLC read operation is indicated (S803=No), the received address information is checked to determine whether the address indicates a least significant bit (LSB) or a most significant bit (MSB) (S804). In accordance with this determination either the LSB (S806) of the MSB (S807) is read. Thereafter, if an ECC capability is associated with the MLC read data, the ECC functionality is performed to correct errant data (808). Where ECC is indicated and after being performed, a copyback operation need not necessarily be performed in relation to the implicated memory block. Rather, the number of bits per memory cell to be subsequently stored in the memory block may be reduced, thereby increasing read margin between associated voltage distributions (S812).

However, if a SLC read operation is indicated (S9=803=Yes), the SLC is read (S805). Thereafter, if an ECC capability is associated with the read data, the ECC functionality is performed to correct errant data (809). Where ECC is indicated and after being performed, a copyback operation is performed (S811), and the implicated memory block is marked as a bad block (S813).

In either case, where no ECC capability is apparent or required because the read data contains no errors, or after completion of ECC related operations, the method ends (S820).

Figure 9:
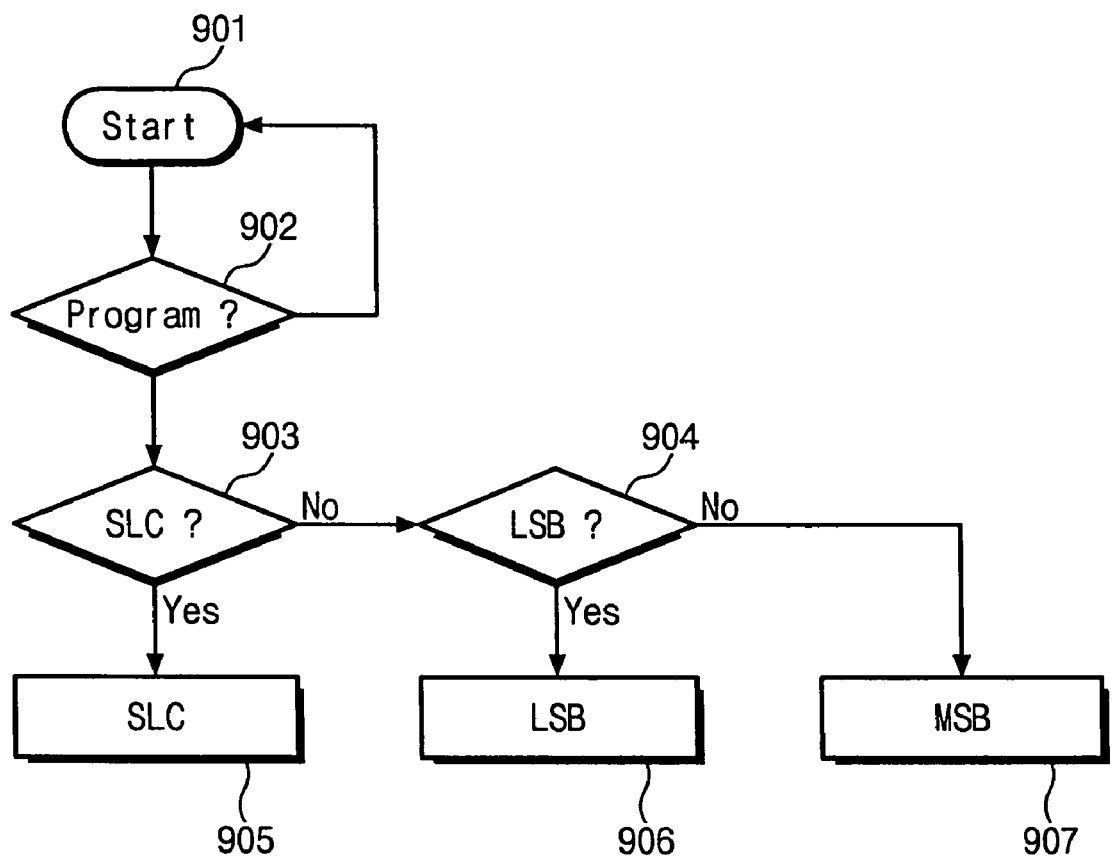
FIG. 9 is a flowchart illustrating a write operation method of a nonvolatile memory device which is capable of storing N bits per cell (N>1) according to the present invention.

FIG. 9 is a flowchart illustrating an example of a write operation which may be performed in a memory system consistent with the foregoing embodiments. The write operation method includes determining whether an externally input command is a write command (S902); verifying an SLC/MLC flag to check bit-per-cell information of a corresponding block (S903); conducting a write operation in case of a single-bit nonvolatile memory (905); checking an address of each bit n case of a multi-bit nonvolatile memory; and conducting a write operation according to corresponding addresses (S907 and S908).

In sum, a nonvolatile memory device and related memory system according to embodiments of the invention make it possible to use both the superior data storage capacity of a multi-bit flash memory and the high reliability of a single-bit flash memory.

Although the present invention has been described in connection with the illustrated embodiments, it is not limited thereto. It will be apparent to those skilled in the art that various substitutions, modifications and changes may be thereto without departing from the scope of the invention as defined by the attached claims.

What is claimed is:

1. A nonvolatile memory device comprising:
    a memory cell array comprising a plurality of memory blocks each having a plurality of memory cells adapted to store N bits, where N is an integer greater than 1;
    a page buffer configured to perform a read operation adapted to read data from the memory cell array and output read data;
    an error correction circuit configured to detect and correct an error in read data stored in a memory block K and generate corresponding error information; and
    a control circuit configured to reduce the number of bits stored in the plurality of memory cells for memory block K from N to J, where J is an integer less than N but greater than zero, in response to the error information.

2. The nonvolatile memory device of claim 1, wherein the memory cell array comprises a main data storage region adapted to store data and a spare data storage region adapted to store spare data associated with the data stored in the main storage region.

3. The nonvolatile memory device of claim 2, wherein the spare data comprises bit number data defining respectively the number of bits stored in the memory cells of each one of the plurality of memory blocks.

4. The nonvolatile memory device of claim 3, wherein the bit number data comprises a single-bit or multi-bit flag.

5. The nonvolatile memory device of claim 2, wherein the spare data storage region includes independent spare data associated with each one of the plurality of memory blocks.

6. The nonvolatile memory device of claim 1, wherein the control circuit is further configured to define memory block K as a bad block.

7. The nonvolatile memory device of claim 1, wherein the control circuit is further configured to perform a copyback operation for data stored in memory block K into a new memory block.

8. The nonvolatile memory device of claim 1, wherein the control circuit is further configured to control the page buffer to perform the read operation.

9. The nonvolatile memory device of claim 1, wherein the memory cell array comprises a NAND flash memory cell array.

10. The nonvolatile memory device of claim 8, wherein the N is equal to 2.

11. A non-volatile memory system comprising:
    a memory controller configured to control read operations associated with a nonvolatile memory device, the nonvolatile memory device comprising:
        a memory cell array comprising a plurality of memory blocks each having a plurality of memory cells adapted to store N bits, where N is an integer greater than 1, wherein the memory cell array comprises a main data storage region adapted to store data and a spare data storage region adapted to store spare data associated with the data stored in the main storage region; and
        a page buffer configured to perform the read operation in relation to the memory cell array and output read data;

the memory controller being configured to implement an error correction capability (ECC) adapted to detect and correct an error in the read data stored in a memory block K, and reduce the number of bits stored in the plurality of memory cells for memory block K from N to J, where J is an integer less than N but greater than zero, in response to the error detection.

12. The nonvolatile memory system of claim 11, wherein the spare data comprises a single-bit or multi-bit flag indicating that any one of the plurality of memory blocks is a bad block.

13. The nonvolatile memory system of claim 11, wherein the memory controller comprises a separate error correction circuit implementing the ECC.

14. The nonvolatile memory system of claim 11, wherein nonvolatile memory device comprises a control circuit configured to implement the ECC under the control of the memory controller.

15. The nonvolatile memory system of claim 14, wherein the control circuit comprises an address decoding and control circuit.

16. The nonvolatile memory system of claim 14, wherein the memory controller is further configured to execute software adapted to detect and correct the error and generate corresponding error information; and
    wherein the control circuit is adapted to modify spare data in the spare data storage region to reduce the number of bits stored in the plurality of memory cells for memory block K from N to J in response to the error information.

17. A read method for a nonvolatile memory device comprising a plurality of memory blocks, each comprising memory cells adapted to store N bits, where N is an integer greater than 1, the method comprising:
    upon receiving an externally applied read command associated with a memory block K, determining whether read data stored in memory block K is single-bit data or multiple-bit data;
    if the read data is single-bit data and contains an error,
        reading and performing an error correction operation on the single-bit data, and marking memory block K as a bad block;
    else if, the read data is multi-bit data and contains an error,
        reading and performing an error correction operation on the multi-bit data, and reducing the number of bits stored in the memory cells of memory block K from N to J, where J is an integer less than N but greater than zero.

18. The read method of claim 17, wherein the determination of whether the read data stored in memory block K is single-bit data or multiple-bit data controls the manner by which a page buffer performs the read operation.

19. The read method of claim 17, wherein in conjunction with marking memory block K as a bad block, a copyback operation is performed with respect to the read data stored in memory block K to a new memory block.

20. The read method of claim 17, wherein multi-bit data is 2 bit data and is read as a least significant bit or a most significant bit.

* * * * *